(12) United States Patent
Tokuyama

(10) Patent No.: US 7,915,966 B2
(45) Date of Patent: Mar. 29, 2011

(54) OSCILLATOR FOR CONTROLLING VOLTAGE

(75) Inventor: Masato Tokuyama, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 40 days.

(21) Appl. No.: 12/398,452

(22) Filed: Mar. 5, 2009

(65) Prior Publication Data
US 2009/0231051 A1 Sep. 17, 2009

(30) Foreign Application Priority Data
Mar. 11, 2008 (JP) ................. 2008-060648

(51) Int. Cl.
*H03B 5/12* (2006.01)
(52) U.S. Cl. .......... 331/117 R; 331/34; 331/36 R
(58) Field of Classification Search .......... 331/34, 331/36 R, 117 FE, 117 R, 167
See application file for complete search history.

(56) References Cited

U.S. PATENT DOCUMENTS

| | | | |
|---|---|---|---|
| 6,680,655 B2 * | 1/2004 | Rogers | 331/109 |
| 7,336,138 B2 * | 2/2008 | Kitamura et al. | 331/186 |
| 2003/0146795 A1 * | 8/2003 | Albon et al. | 331/36 C |
| 2004/0251977 A1 * | 12/2004 | Bellaouar et al. | 331/117 R |
| 2006/0132253 A1 * | 6/2006 | Gelhausen et al. | 331/167 |

FOREIGN PATENT DOCUMENTS

| | | |
|---|---|---|
| JP | 2006-245774 | 9/2006 |
| JP | 2007-189591 | 7/2007 |
| JP | 2007-306421 | 11/2007 |

* cited by examiner

*Primary Examiner* — Robert Pascal
*Assistant Examiner* — Levi Gannon
(74) *Attorney, Agent, or Firm* — Cooper & Dunham LLP

(57) ABSTRACT

The present invention relates to a resonance type voltage control oscillator. The voltage control oscillator includes an inductor unit including two inductances serially coupled to each other, a variable capacitance unit coupled to the inductor unit in parallel, a negative resistance unit coupled to the inductor unit in parallel, a first variable resistor having a resistance value corresponding to an input first control signal, a second variable resistor having a resistance value corresponding to an input second control signal, and a variable resistor control circuit unit generating the first and second control signals and controlling respective resistance values of the first and second variable resistors. The variable resistor control circuit unit controls the respective resistance values of the first and second variable resistors to set current flowing in the inductor unit, the variable capacitance unit and the negative resistance unit to a desired current value.

13 Claims, 11 Drawing Sheets

OSCILLATOR FOR CONTROLLING VOLTAGE

BACKGROUND

1. Technical Field

This disclosure relates to a voltage control oscillator including a resonance circuit having an inductor, a variable capacitor and a negative resistor in a CMOS analog circuit.

2. Description of the Related Art

In a resonance type of voltage control oscillator where a CMOS process is used, a spiral inductor, a varactor (variable capacitance diode) and a transistor may be commonly used as an element component, a variable capacitor and a negative resistor, respectively. However, characteristics of these elements may be variable, and thus tolerances must be provided for the variations of the elements in order to achieve stable oscillation. For example, if the negative resistor satisfactorily fails to cancel equivalent parallel resistance caused by parasitic resistance in a resonance circuit, it would not be difficult to achieve such stable oscillation. For this reason, current may be commonly supplied from a constant current source for relatively stable negative resistance of the negative resistor.

As such a constant current supplying method, there may be two methods, one method where a constant current is supplied from a Pch transistor at the power source side in an oscillation circuit and the other method where a constant current is supplied from a Nch transistor at the ground voltage side in the oscillation circuit. In these methods, a gate voltage of a current controlling transistor is folded back from the constant current source by a current mirror circuit, which may generate a current at an amount proportional to the transistor size.

Another important characteristic of the voltage control oscillator may be a phase noise characteristic.

Various approaches have been proposed to improve the phase noise characteristic. In one exemplary approach, a Pch transistor may generate a constant current between a resonance circuit and a power source, and resistance may be applied between the resonance circuit and the Pch transistor. As a result, even harmonics involved in oscillation are turned back, thereby degradation of the phase noise can be avoided. For example, this approach may be described in detail in Japanese Laid-Open Patent Publication No. 2006-245774.

In another exemplary approach, a Nch transistor may generate a constant current between a resonance circuit and the ground voltage. At activation, a gate voltage generated from the constant current source in a current mirror circuit is stored in a capacitor, and in a steady state, the constant current source is separated from the current mirror circuit. As a result, influence from noise of the constant current source and noise of a transistor in the current mirror circuit can be avoided. For example, this approach may be described in detail in Japanese Laid-Open Patent Publication No. 2007-189591.

In the resonance type of voltage control oscillator where the CMOS process is used, the constant current is conventionally supplied from a constant current source to a resonance circuit including a current mirror circuit with a transistor in order to control current of the resonance circuit. In this case, however, shot noise and flicker noise caused in the transistor in the current mirror circuit may be introduced in the resonance circuit, resulting in degraded phase noise. In order to improve this problem, the transistor must have a greater gate length, thereby causing enlargement of the layout area. Thus, this approach may provide limited solution for the problem.

In addition, the flicker noise becomes larger in proportion to 1/f and thus may be larger than thermal noise of a resistor in less than or equal to hundreds of micro Hertz. In addition, the constant current source itself may consist of a large number of elements including a transistor, and the improvement can be expected through feedback operations. However, when the current is amplified X times in the current mirror circuit, the noise may be also amplified X times, which may not be negligible. In this manner, the supplying of current from the constant current source can lead to stable operations of the oscillator as well as enable consumption of the current to be controlled. On the other hand, there is a problem in that this approach cannot improve the phase noise characteristic.

BRIEF SUMMARY

In an aspect of this disclosure, there is provided a resonance type of voltage control oscillator that can exclude influence of the shot noise and the flicker noise of a transistor in a current mirror circuit used to amplify and fold back current and noise of a constant current source by disabling the constant current source to be used for current control of an oscillation circuit.

In another aspect of this disclosure, there is provided a resonance type voltage control oscillator for generating a signal with a frequency corresponding to an input voltage, including: an inductor unit configured to include two inductors serially coupled to each other; a variable capacitance unit coupled to the inductor unit in parallel; a negative resistance unit configured to serve as a negative resistor coupled to the inductor unit in parallel; a first variable resistor configured to have a resistance value corresponding to an input first control signal, the first variable resistor being coupled between a connection between resistors in the negative resistance unit and a negative side source voltage; a second variable resistor configured to have a resistance value corresponding to an input second control signal, the second variable resistor being coupled between a positive side source voltage and a connection between the inductors; and a variable resistor control circuit unit configured to generate the first control signal and the second control signal and control respective resistance values of the first variable resistor and the second variable resistor, wherein the variable resistor control circuit unit is configured to control the respective resistance values of the first variable resistor and the second variable resistor to set current flowing in the inductor unit, the variable capacitance unit and the negative resistance unit to a desired current value.

Other aspects, features and advantages will become more apparent from the following detailed description when read in conjunction with the accompanying drawings.

BRIEF DESCRIPTION OF THE DRAWINGS

In the figures of the accompanying drawings, like reference numerals refer to similar elements.

DETAILED DESCRIPTION OF THE PREFERRED EMBODIMENTS

In the following description, for the purposes of explanation, numerous specific details are set forth in order to provide a thorough understanding of the present invention. It will be apparent, however, that the present invention may be practiced without these specific details. In other instances, well-known structures and devices are shown in block diagram form in order to avoid unnecessarily obscuring the present invention.

Figure 1:
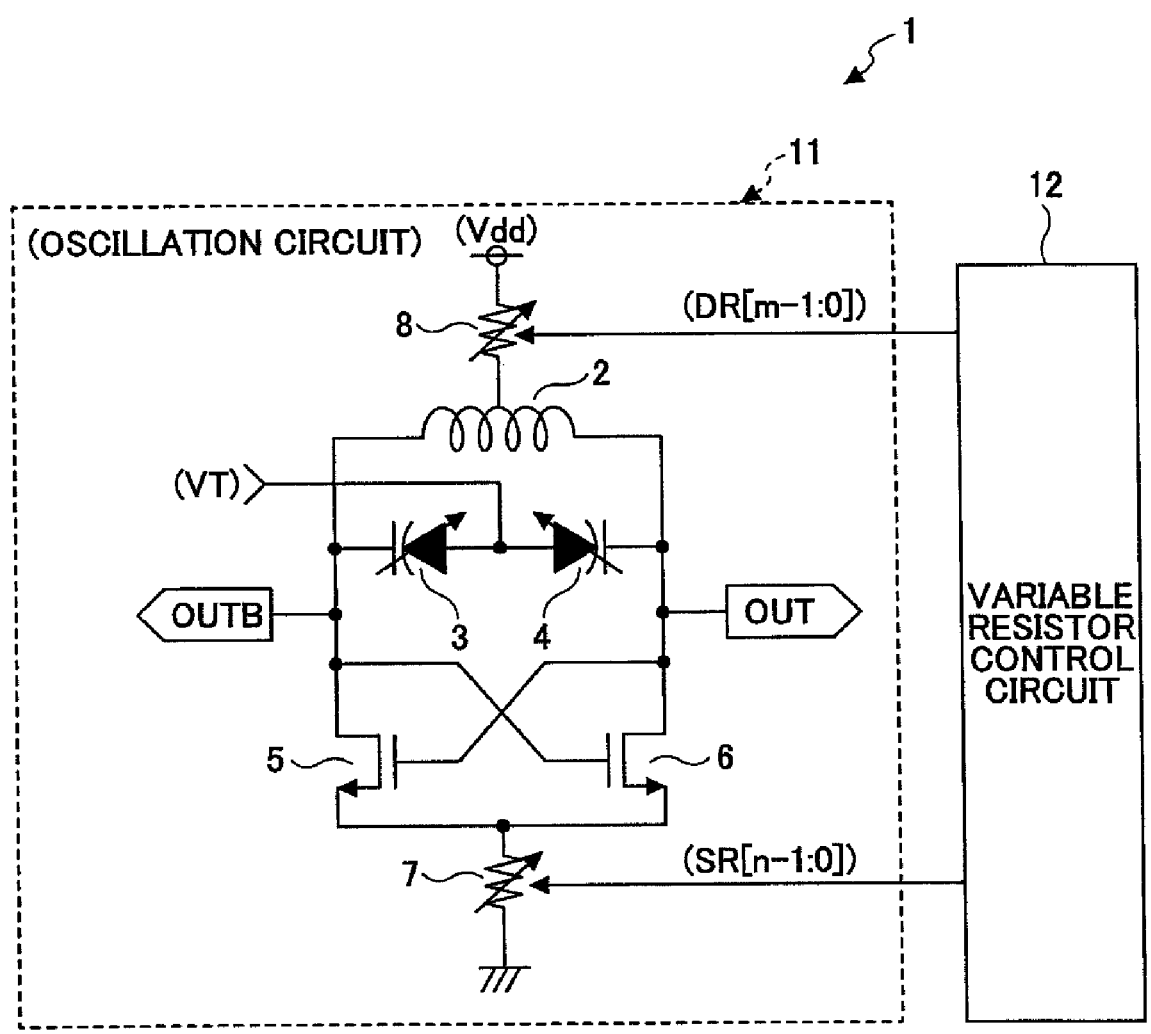
FIG. 1 illustrates an exemplary configuration of a voltage control oscillator according to a first embodiment of the present invention.

FIG. 1 illustrates an exemplary configuration of a voltage control oscillator according to the first embodiment of the present invention.

In FIG. 1, a voltage control oscillator includes an oscillation circuit 11 having an inductor 2, varactors 3, 4 being variable capacitance diodes, NMOS transistors 5, 6 cross-coupled to each other as negative resistors and variable resistors 7, 8 and a variable resistor control circuit 12 for controlling respective resistance values of the variable resistors 7, 8.

In this embodiment, the inductor 2 serves as an inductor unit. The varactors serve as a variable capacitance unit. The NMOS transistors 5, 6 serve as a negative resistance unit. The variable resistors 7, 8 serve as first and second variable resistors, respectively. The variable resistor control circuit 12 serves as a variable resistor control circuit unit. Also, the NMOS transistors 5, 6 serve as first and second transistors, respectively.

The variable resistor 8 is coupled between a voltage source Vdd for providing a positive source voltage and a middle point of the inductor 2 and has variable resistance values depending on a second control signal DR[m-1:0] of m bits (m is a positive integer) from the variable resistor control circuit 12. One end of the inductor 2 is coupled to a drain of the NMOS transistor 5, and the other end of the inductor 2 is coupled to a drain of the NMOS transistor 6. Sources of the NMOS transistors 5, 6 are coupled to each other, and the connection is coupled to a ground voltage for providing a negative source voltage via the variable resistor 7. The variable resistor 7 has variable resistance values depending on a first control signal SR[n-1:0] of n bits (n is a positive integer) from the variable resistor control circuit 12.

A gate of the NMOS transistor 5 is coupled to a drain of the NMOS transistor 6, and the connection serves as an output end OUT. Similarly, a gate of the NMOS transistor 6 is coupled to a drain of the NMOS transistor 5, and the connection serves as an output end OUTB. A cathode side end of the varactor 3 is coupled to the connection between the inductor 2 and the NMOS transistor 5, and a cathode side end of the varactor 4 is coupled to the connection between the inductor 2 and the NMOS transistor 6. Anode side ends of the varactors 3, 4 are coupled to each other, and the connection receives a control voltage VT from an exterior.

Although a 3-terminal inductor is used as the inductor 2 in FIG. 1, in other embodiments, a pair of 2-terminal inductors may be serially coupled to each other. Also, the control voltage VT does not have to be supplied to both of the varactors 3, 4, and in other embodiments, fixed capacitors such as MIM capacitors may be coupled to the varactors 3, 4 in parallel.

Figure 2:
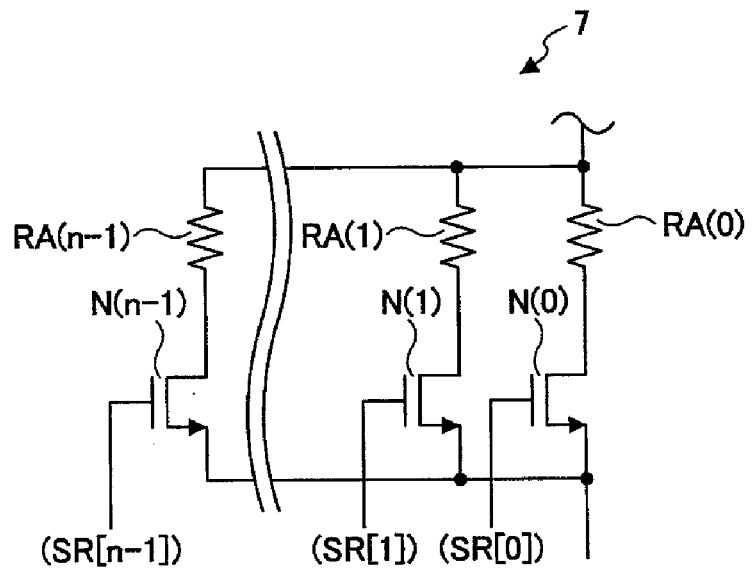
FIG. 2 illustrates an exemplary circuit of a variable resistor 7 in FIG. 1.
Figure 3:
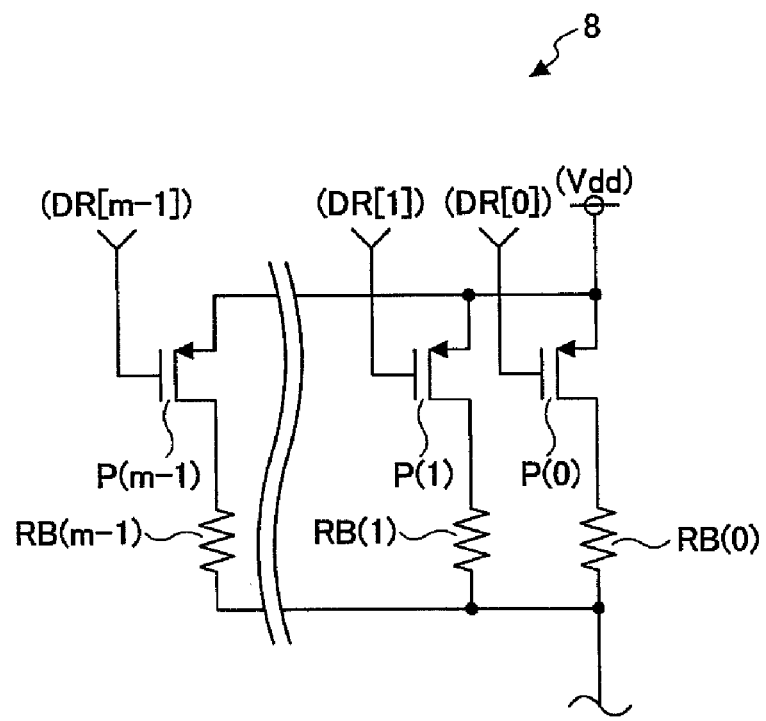
FIG. 3 illustrates an exemplary circuit of a variable resistor 8 in FIG. 1.

FIG. 2 illustrates an exemplary circuit arrangement of the variable resistor 7 in FIG. 1. FIG. 3 illustrates an exemplary circuit arrangement of the variable resistor 8 in FIG. 1.

In FIG. 2, the variable resistor 7 includes n resistors RA(0) to RA(n-1) and n NMOS transistors N(0) to N(n-1). The resistors RA(0) to RA(n-1) are serially coupled to drains of the corresponding NMOS transistors N(0) to N(n-1), respectively, and the resulting serial circuits are coupled to each other in parallel between the connection between the sources of the NMOS transistors 5, 6 and the ground voltage. Also, individual bit signals SR[0] to SR[n-1] of the first control signal SR[n-1:0] from the variable resistor control circuit 12 are supplied to corresponding gates of the NMOS transistors N(0) to N(n-1).

It is desirable that the transistor size of the NMOS transistors N(0) to N(n-1) have a greater (gate width W/gate length L) to achieve lower ON resistance. In addition, the respective resistance values of the resistors RA(0) to RA(n-1) are determined in consideration of the ON resistance of the NMOS transistors N(0) to N(n-1). For example, the respective resistance values of the resistors RA(0) to RA(n-1) may be weighted with ratios of a power of two, and the resistance value of the variable resistor 7 may be adjusted based on a resolution dependent on the number of resistors coupled in parallel.

In FIG. 3, the variable resistor 8 includes m resistors RB(0) to RB(m-1) and m PMOS transistors P(0) to P(m-1). The resistors RB(0) to RB(m-1) are serially coupled to corresponding drains of the PMOS transistors P(0) to P(m-1), respectively, and the resulting serial circuits are coupled to each other in parallel between the source voltage Vdd and the inductor 2. Also, individual bit signals DR[0] to DR[m-1] of the second control signal DR[m-1:0] from the variable resistor control circuit 12 are supplied to corresponding gates of the PMOS transistors P(0) to P(m-1).

Similar to the variable resistor 7, it is desirable that the PMOS transistors P(0) to P(m-1) in the variable resistor 8 have a greater (gate width W/gate length L) to achieve lower ON resistance. In addition, the respective resistance values of the resistors RB(0) to RB(m-1) are determined in consideration of the ON resistance of the PMOS transistors P(0) to P(m-1). For example, the respective resistance values of the resistors RB(0) to RB(m-1) may be weighted with ratios of a power of two, and the resistance value of the variable resistor 8 may be adjusted based on a resolution dependent on the number of resistors coupled in parallel.

In FIGS. 2 and 3, the variable resistor control circuit 12 uses the first control signal SR[n-1:0] to selectively turn on the NMOS transistos N(0) to N(n-1) for transition to a conductive state and controls the resistance value of the variable resistor 7. In addition, the variable resistor control circuit 12 uses the second control signal DR[m-1:0] to selectively turn on the PMOS transistors P(0) to P(m-1) for transition to the conductive state and controls the resistance value of the variable resistor 8.

Figure 4:
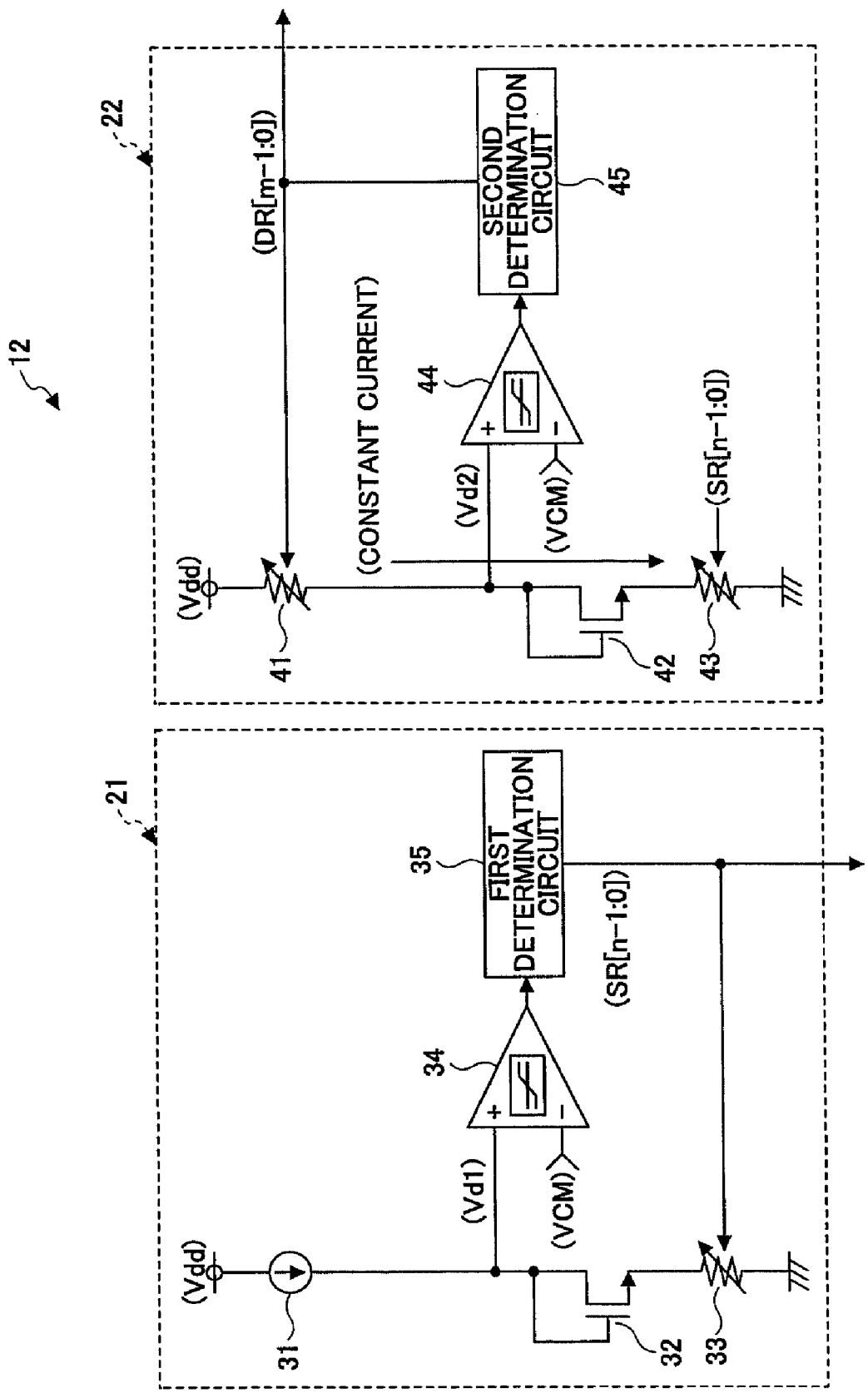
FIG. 4 illustrates an exemplary circuit of a variable resistor control circuit 12 in FIG. 1.

FIG. 4 illustrates an exemplary circuit arrangement of the variable resistor control circuit 12 in FIG. 1.

In FIG. 4, the variable resistor control circuit 12 includes a first control circuit unit 21 for controlling the variable resistor 7 and a second control circuit unit 22 for controlling the variable resistor 8. The first control circuit unit 21 includes a constant current source 31, a NMOS transistor 32, a variable resistor 33, a comparator 34 and a first determination circuit 35. The second control circuit unit 22 includes variable resistors 41, 43, a NMOS transistor 42, a comparator 44 and a second determination circuit 45.

In this embodiment, the NMOS transistor 32 serves as a first reference transistor. The variable resistor 33 serves as a third variable resistor. The comparator 34 and the first determination circuit 35 serve as a first resistor control circuit. Also, the variable resistor 41 serves as a fourth variable resistor. The NMOS transistor 42 serves as a second reference transistor. The variable resistor 43 serves as a fifth variable resistor. The comparator 44 and the second determination circuit 45 serve as a second resistor control circuit.

In the first control circuit unit 21, the constant current source 31 is coupled between a source voltage Vdd and a drain of the NMOS transistor 32, and the variable resistor 33 is coupled between a source of the NMOS transistor 32 and a ground voltage. A gate of the NMOS transistor 32 is coupled to a drain of the NMOS transistor 32, and the connection is coupled to a non-inverted input end of the comparator 34. A predefined reference voltage VCM is supplied to an inverted input end of the comparator 34. The comparator 34 generates and supplies a signal indicative of a voltage comparison result to the first determination circuit 35. Based on the signal supplied from the comparator 34, the first determination circuit 35 generates a first control signal SR[n−1:0] to switch at least one of the NMOS transistors N(0) to N(n−1) ON without switching all of the NMOS transistors N(0) to N(n−1) OFF. The variable resistor 33 is configured to have a resistance value corresponding to the first control signal SR[n−1:0].

In the second control circuit unit 22, the variable resistor 41 is coupled between the source voltage Vss and a drain of the NMOS transistor 42, and the variable resistor 43 is coupled between a source of the NMOS transistor 42 and the ground voltage. A gate of the NMOS transistor 42 is coupled to a drain of the NMOS transistor 42, and the connection is coupled to a non-inverted input end of the comparator 44. A predefined reference voltage VCM is supplied to an inverted input end of the comparator 44. The comparator 44 generates and supplies a signal indicative of a voltage comparison result to the second determination circuit 45. Based on the signal supplied from the comparator 44, the second determination circuit 45 generates a second control signal DR[m−1:0] to switch at least one of the PMOS transistors P(0) to P(m−1) ON without switching all the PMOS transistors P(0) to P(m−1) OFF. Also, the variable resistor 41 is configured to have a resistance value corresponding to the second control signal DR[m−1:0], and the variable resistor 43 is configured to have a resistance value corresponding to the first control signal SR[n−1:0] generated and supplied by the first determination circuit 35.

In the above-mentioned configuration, in the first control circuit unit 21, the constant current source 31 is composed of a current mirror circuit with a PMOS transistor, for example. Since a current value flowing to the NMOS transistor 32 ends up being a consumption current of the oscillation circuit in FIG. 1, a desired current must be supplied from the constant current source 31 in consideration of this fact. The NMOS transistor 32 has the same size as the total size of the NMOS transistors 5, 6 in FIG. 1, and the variable resistor 33 is the same as the variable resistor 7 in FIG. 1. Also, the reference voltage VCN must be determined to obtain a sufficient oscillation amplitude and a satisfactory phase noise. Since variations of a threshold voltage VTH for the NMOS transistor 32 must be absorbed in the variable resistor 33, the reference voltage VCM may be set to be a relatively high voltage, for example, a constant voltage corresponding to an amount relatively lower than half of the source voltage Vdd. Based on a voltage comparison result between a drain voltage Vd1 of the NMOS transistor 32 and the reference voltage VCM, the first determination circuit 35 generates the first control signal SR[n−1:0] to obtain the optimum resistance value of the variable resistor 7.

Figure 5:
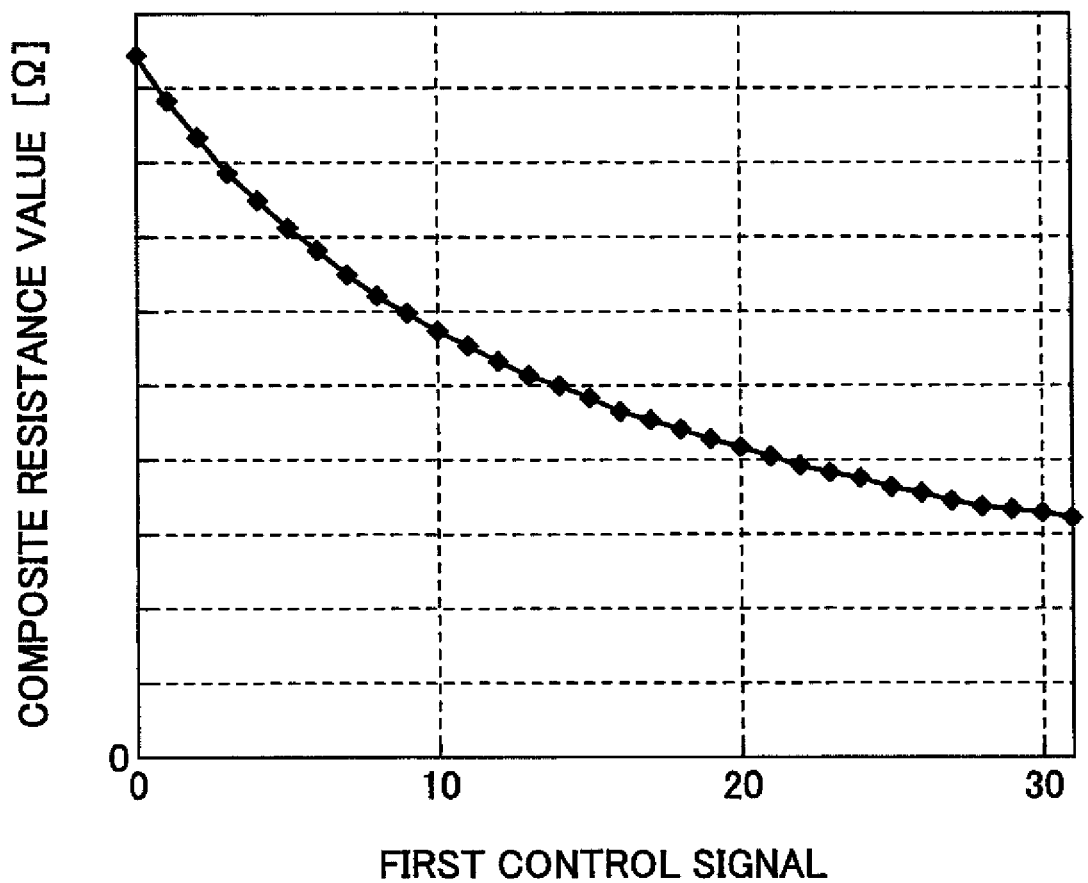
FIG. 5 illustrates exemplary variations of a resistance value of the variable resistor 7 in the case of n=5.

FIG. 5 illustrates exemplary variations of the resistance value of the variable resistor 7 in the case of n=5. In FIG. 5, the circuit in FIG. 2 is assumed under the case where a resistor with the same resistance value as the upper bit (the lowest resistance value) is coupled in parallel to a serial circuit consisting of the resistor RA(0) and the NMOS transistor N(0) for offset, and under this assumption, the variations of the resistance value of the variable resistor 7 corresponding to incrementing the first control signal SR[4:0] from 00h are illustrated.

In FIG. 5, the vertical axis represents a composite resistance value of the variable resistor 7, and the horizontal axis represents variations of the binary first control signal SR[4:0] in the decimal number. It can be observed that the composite resistance value of the variable resistor 7 has monotonically decreasing characteristics in 32 steps.

Figure 6:
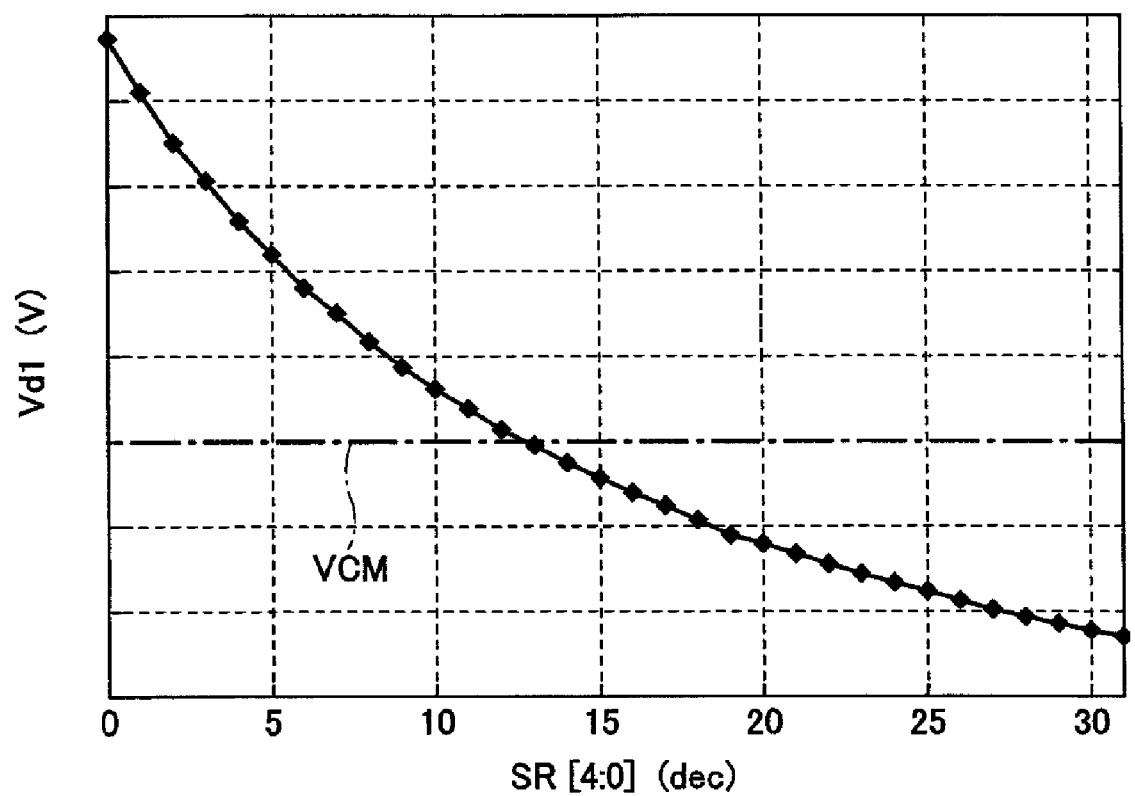
FIG. 6 illustrates an exemplary operation of a first control circuit unit 21 in FIG. 4 in the case of n=5.

FIG. 6 illustrates an exemplary operation of the first control circuit unit 21 in FIG. 4 in the case of n=5.

In FIG. 6, the first determination circuit 35 increments the first control signal SR[4:0] from 00h. Then, the first determination circuit 35 determines from an output signal of the comparator 34 whether the drain voltage Vd1 of the NMOS transistor 32 becomes lower than the reference voltage VCM and saves the first control signal SR[4:0] at the time when the drain voltage Vd1 becomes lower than the reference voltage VCM.

The second control circuit 22 is the same as the first control circuit unit 21 except that the constant current source 31 is replaced with the variable resistor 41. The NMOS transistor 42 has the same transistor size as the total transistor size of the NMOS transistors 5, 6 in FIG. 1. The variable resistor 41 is the same as the variable transistor 8 in FIG. 1, and the variable transistor 43 is the same as the variable transistor 7 in FIG. 1. The second determination circuit 45 generates the second control signal DR[m−1:0] to obtain the optimum resistance value of the variable resistor 8 based on a voltage comparison result from the comparator 44 between the drain voltage Vd2 of the NMOS transistor 42 and the reference voltage VCM.

On the other hand, variations of the resistance value of the variable resistor B in the case of m=5 would have similar characteristics to the variable resistor 7 as illustrated in FIG. 5 if a resistor with the same resistance value as that of the upper bit (the lowest resistance value) is coupled in parallel to a serial circuit consisting of the resistor RA(0) and the PMOS transistor P(0) for offset and individual bit signals of the control signal DR[4:0] are set to be an inversion of the signal level of the individual bit signals of the control signal SR[4:0].

Figure 7:
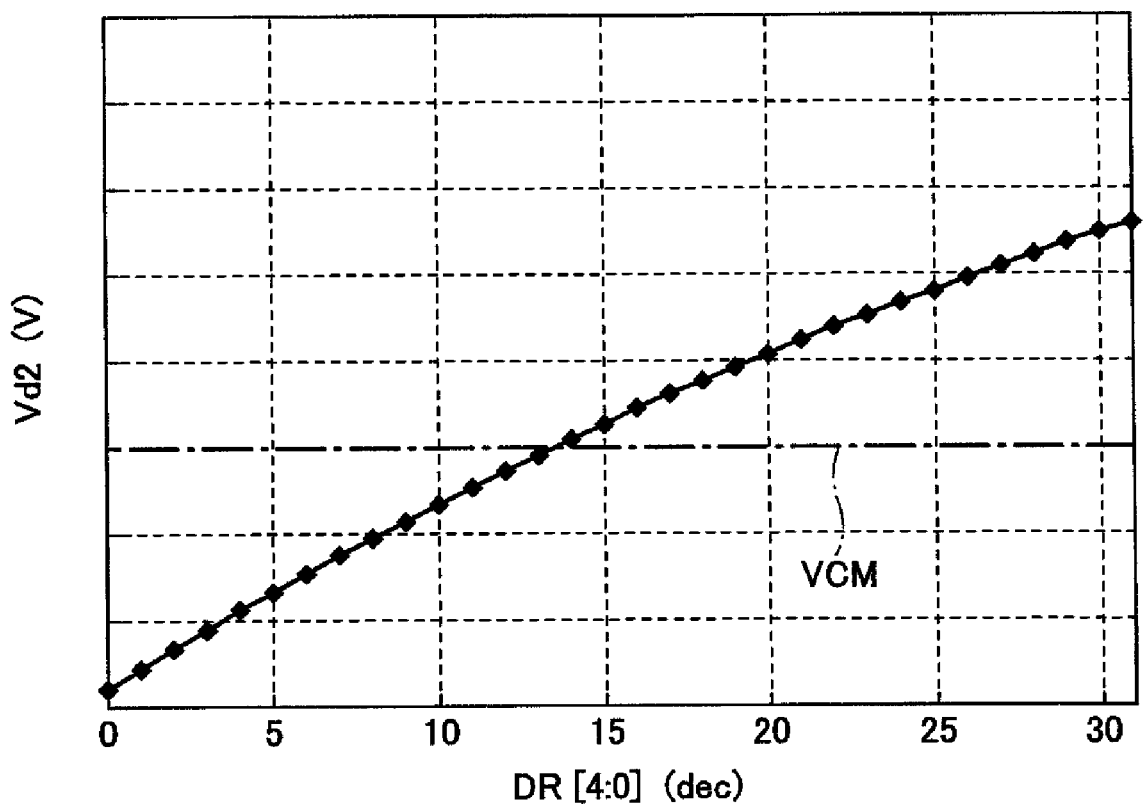
FIG. 7 illustrates an exemplary operation of a second control circuit unit 22 in FIG. 4 in the case of m=5.

FIG. 7 illustrates an exemplary operation of the second control circuit unit 22 in FIG. 4 in the case of m=5.

In FIG. 7, the second determination circuit 45 increments the second control signal DR[4:0] from 00h. Then, the second determination circuit 45 determines from an output signal of the comparator 44 whether the drain voltage Vd2 of the NMOS transistor 42 becomes higher than the reference voltage VCM and saves the second control signal DR[4:0] at the time when the drain voltage Vd2 becomes higher than the reference voltage VCM. At this time, the control signal SR[4:0] saved in the first determination circuit 35 is stored in the variable resistance 43.

In other embodiments, a smaller amount of current may be consumed in the variable resistor control circuit 12 by setting the ratio of the consumption current values of the oscillation circuit 11 and the first and second control circuit units 21, 22 to X:1.

Figure 8:
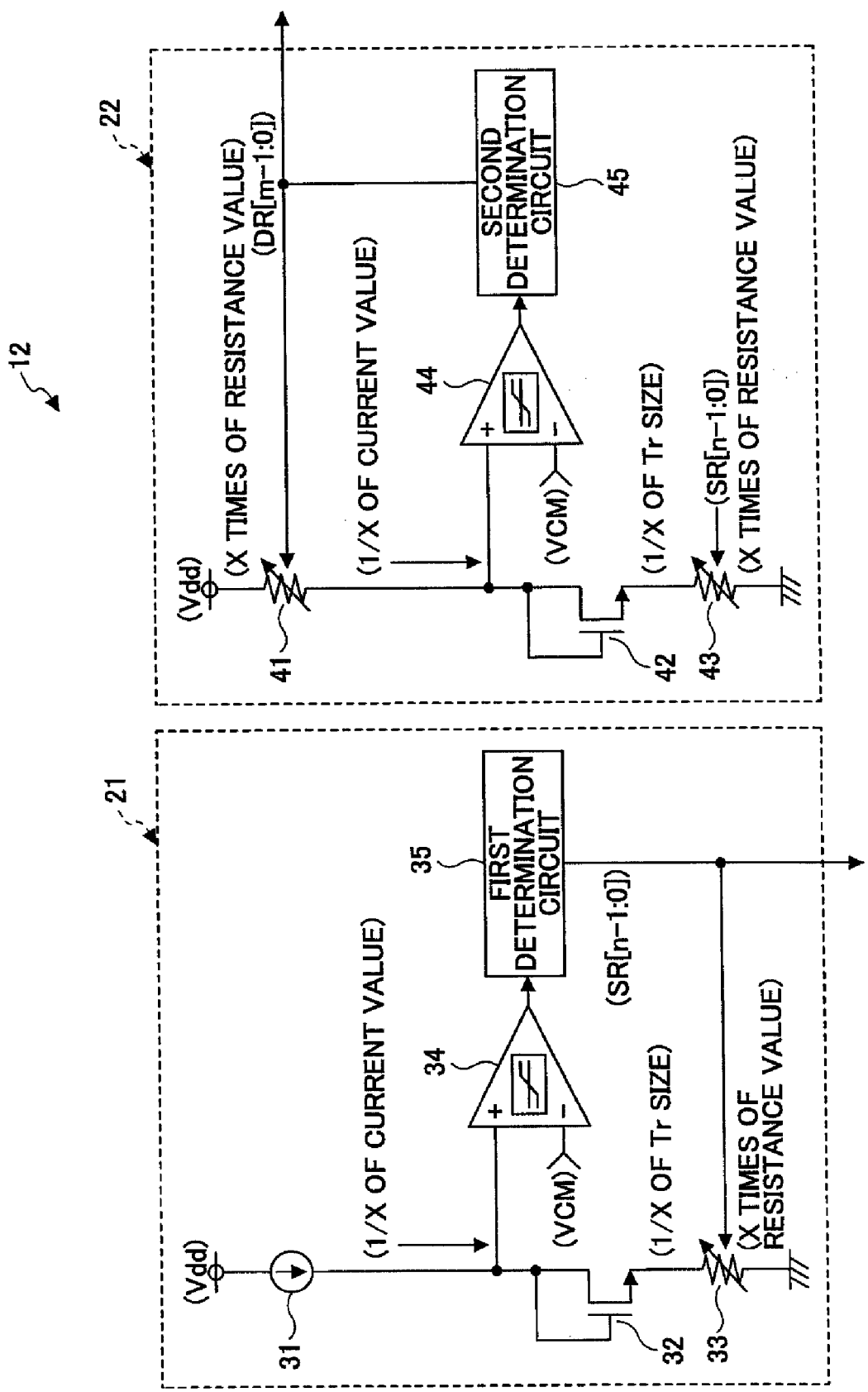
FIG. 8 illustrates another exemplary circuit of the variable resistor control circuit 12 in FIG. 1.

For example, in the first control circuit unit 21 in FIG. 8, the current value of the constant current source 31 may be set to 1/X of the current value of the constant current source 31 in FIG. 4. Also, the transistor size (illustrated as TR size) of (gate width W/gate length L) of the NMOS transistor 32 may be set to 1/X of the transistor size of the NMOS transistor 32 in FIG. 4, and the resistance value of the variable resistor 33 may be set to X times of the resistance value of the variable resistor 33 in FIG. 4. In the first control circuit unit 21 in FIG. 8, the same operation point as the case in FIG. 4 can be achieved. Similarly, in the second control circuit unit 22 in FIG. 8, the respective resistance values of the variable resistors 41, 43 may be set to X times of the resistance values of the variable resistors 41, 43 in FIG. 4. Also, the transistor size of (gate width W/gate length L) of the NMOS transistor 42 may be set to 1/X of the transistor size of the NMOS transistor 42 in FIG. 4. In the second control circuit unit 22 in FIG. 8, the same operation point as the case in FIG. 4 can be achieved. In this manner, the current consumed in the first control circuit unit 21 and the second control circuit unit 22 can be reduced to 1/X of the current consumed in the configuration illustrated in FIG. 4. Note that X is an arbitrary real number and does not have to be an integer.

Figure 9:
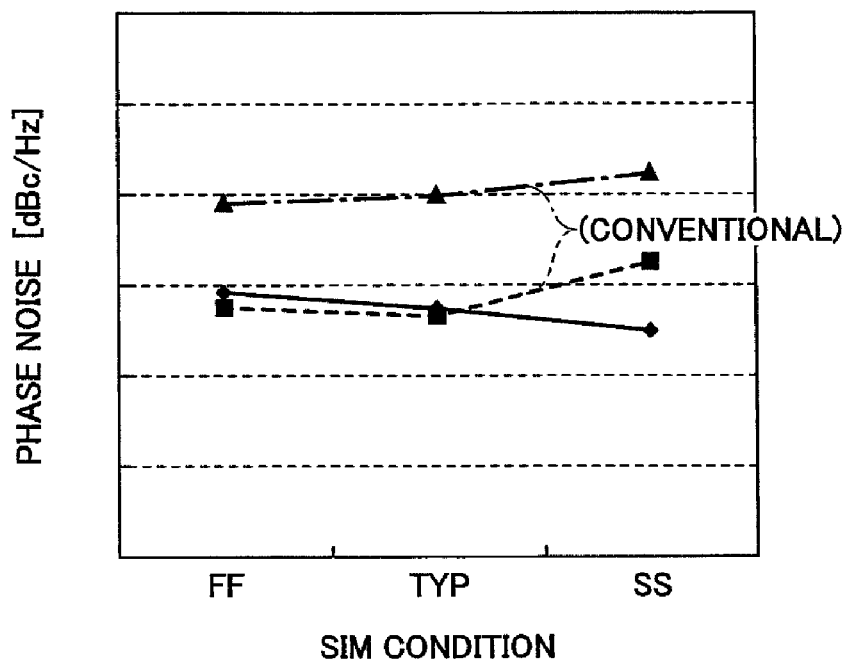
FIG. 9 illustrates an exemplary phase noise characteristic in the voltage control oscillator 1 in FIG. 1.
Figure 10:
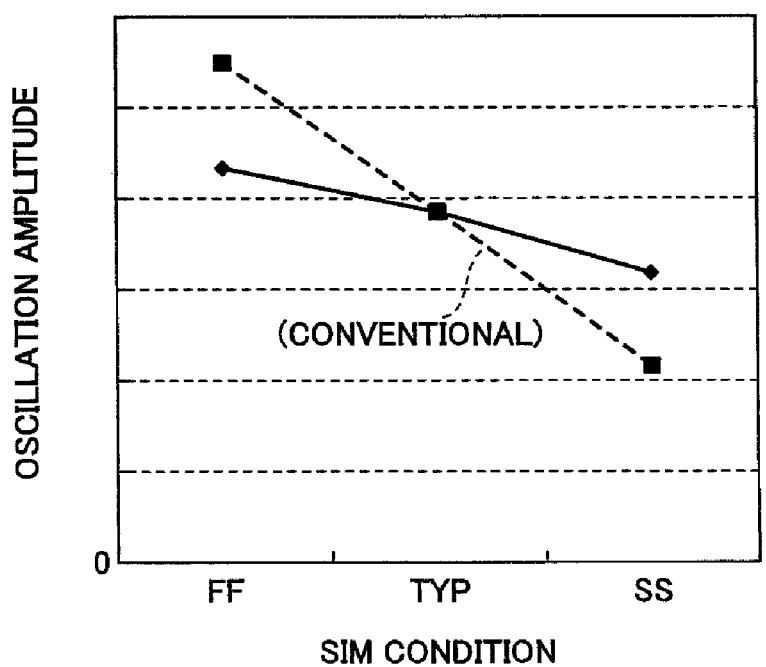
FIG. 10 illustrates exemplary variations of an oscillation amplitude in the voltage control oscillator 1 in FIG. 1.
Figure 11:
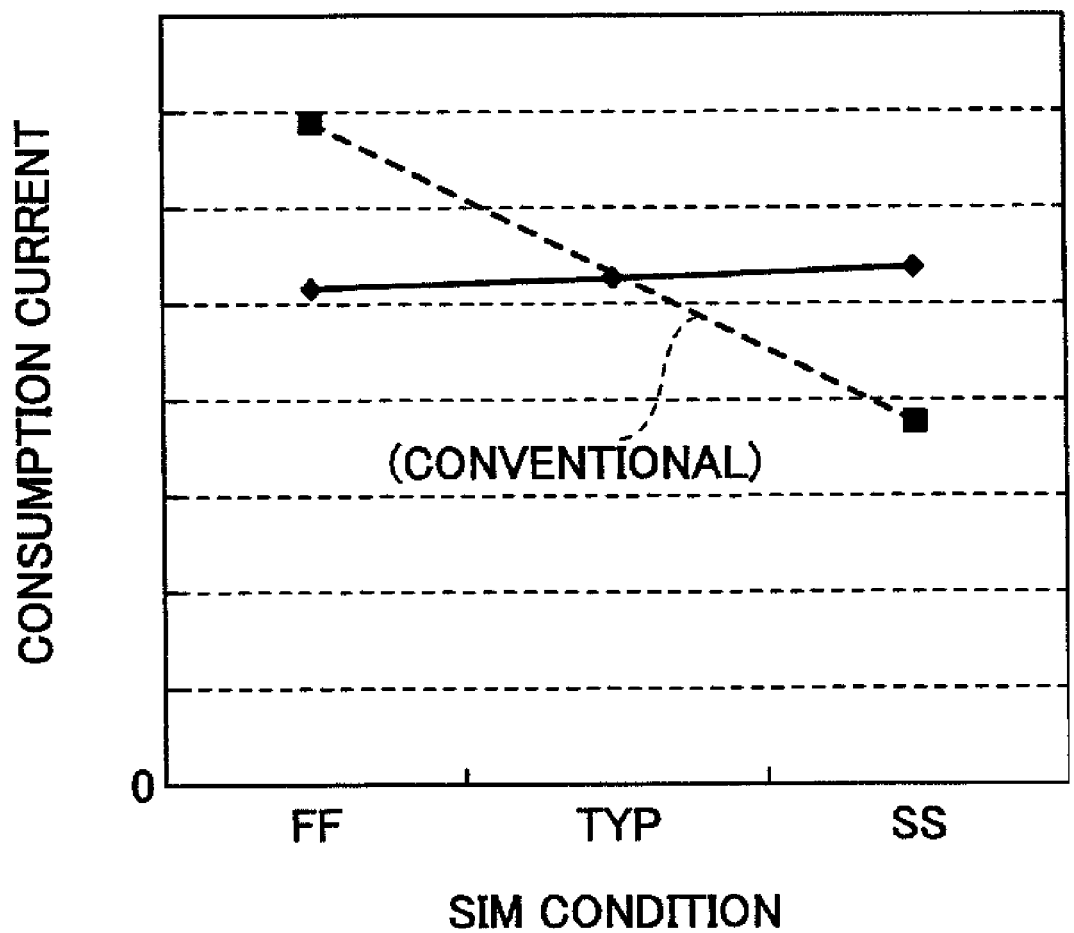
FIG. 11 illustrates exemplary variations of a consumption power in the voltage control oscillator 1 in FIG. 1.

FIG. 9 illustrates an exemplary 10 kHz offset phase noise characteristic of the voltage control oscillator 1. FIG. 10 illustrates exemplary variations of the oscillation amplitude of the voltage control oscillator 1, and FIG. 11 illustrates exemplary variations of the consumption current of the voltage control oscillator 1. In FIGS. 9 to 11, the horizontal axis represents condition of elements. TYP indicates a case of normal source voltage and temperature. FF indicates a case of high source voltage and low temperature. SS indicates a case of low source voltage and high temperature.

In FIGS. 9 to 11, the solid lines represent cases of the voltage control oscillator 1 according to the first embodiment, and dotted lines represent conventional cases where a fixed resistor is used in the oscillation circuit. In addition, the dashed-dotted line in FIG. 9 represents a conventional case where a constant current source is used in the oscillation circuit.

From the illustration in FIG. 9, it can be observed that the voltage control oscillator 1 according to the first embodiment realizes better phase noise characteristics than the conventional case where a constant current source is used in the oscillation circuit. Also, in the conventional case where a fixed resistor is used instead of a controlled variable resistor, slightly better results can be realized under the FF condition and the TYP condition than the voltage control oscillator 1 according to the first embodiment. On the other hand, under the SS condition, the current value is lower, and a transistor serving as a negative transistor cannot have sufficient Vds, resulting in greater phase noise.

Also, as illustrated in FIG. 10, in the conventional case where the fixed resistor is used instead of the controlled variable resistor, gm of the transistor is lower under the SS condition compared to the voltage control oscillator 1 according to the first embodiment. Thus, it becomes harder to achieve satisfactory oscillation condition, resulting in extremely small oscillation amplitude.

Also, as illustrated in FIG. 11, in the conventional case where the fixed resistor is used instead of the controlled variable resistor, there is a drastic increase in the consumption current under the FF condition compared to the voltage control oscillator 1 according to the first embodiment.

As illustrated in FIGS. 9 to 11, the voltage control oscillator 1 according to the first embodiment achieves more stable operations in individual processes than the conventional cases.

In this manner, the voltage control oscillator according to the first embodiment is configured to supply the first control signal SR[n−1:0] generated in the first control circuit unit 21 to the variable resistor 7 as well as supply the second control signal DR[m−1:0] generated in the second control circuit unit 22 to the variable resistor 8. As a result, the oscillation circuit 11 can obtain a constant consumption current without use of any constant current source and thus achieve a desired operation point. Thus, it is possible to eliminate influence of the flicker noise and the shot noise in a transistor that may occur in the current mirror circuit used for noise caused in the constant current source and amplification and folding back of the current.

In the second embodiment, if the first control circuit unit 21 and the second control circuit unit 22 have components or elements sharable with each other, these components or elements are shared or integrated.

In the illustration of an exemplary configuration of a voltage control oscillator according to the second embodiment, the variable resistor control circuit 12 in FIG. 1 is designated as a variable resistor control circuit 12a, and the voltage control oscillator 1 in FIG. 1 is designated as a voltage control oscillator 1a. The components or elements other than the variable resistor control circuit 12a and the voltage control oscillator 1a are the same as those in FIG. 1 and thus may be omitted.

Figure 12:
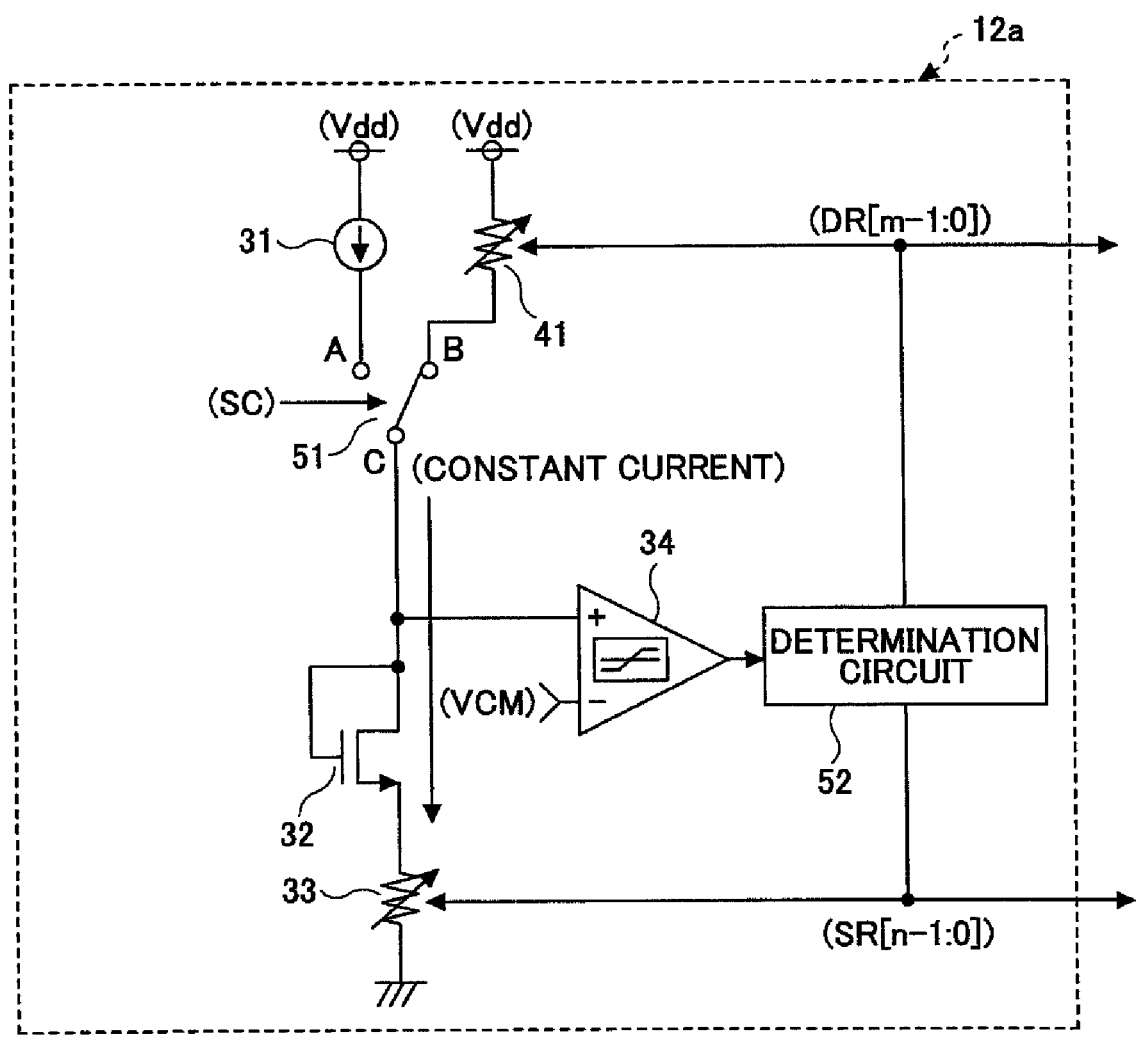
FIG. 12 illustrates an exemplary variable resistor control circuit 12a in a voltage control oscillator according to a second embodiment of the present invention.

FIG. 12 illustrates an exemplary circuit arrangement of the variable resistor control circuit 12a in the voltage control oscillator according to the second embodiment. In FIG. 12, the same or similar components or elements to those in FIG. 4 are designated as the same reference symbols.

In FIG. 12, the variable resistor control circuit 12a includes a constant current source 31, a NMOS transistor 32, a variable resistor 33, a comparator 34, a switch 51 and a determination circuit 52.

In this embodiment, the NMOS transistor 32 serves as a reference transistor. The variable resistor 33 serves as a seventh variable resistor. The variable resistor 41 serves as a sixth variable transistor. The switch 51 serves as a switch circuit. The comparator 34 and the determination circuit 52 serve as a resistor control circuit.

The constant current source 31 is coupled between a source voltage Vdd and a terminal A of the switch 51, and the variable resistor 41 is coupled between the source voltage Vdd and a terminal B of the switch 51. The NMOS transistor 32 and the variable resistor 33 are serially coupled between a common terminal C of the switch 51 and a ground voltage, and the connection between the common terminal C of the switch 51 and a drain of the NMOS transistor 32 is coupled to a non-inverted input end of the comparator 34. A gate of the NMOS transistor 32 is coupled to the drain of the NMOS transistor 32, and a reference voltage VCM is supplied to an inverted input end of the comparator 34.

The comparator 34 generates and supplies a signal indicative of a voltage comparison result to the determination circuit 52. Based on the signal supplied from the comparator 34, the determination circuit 52 generates a first control signal SR[n−1:0] to cause at least one of NMOS transistors N(0) to N(n−1) to turn ON without all the NMOS transistors N(0) to N(n−1) being OFF. In addition, based on the signal supplied from the comparator 34, the determination circuit 52 generates a second control signal DR[m−1:0] to cause at least one of PMOS transistors P(0) to P(m−1) to turn ON without all the PMOS transistors P(0) to P(m−1) being OFF. The variable resistor 33 is set to have a resistance value corresponding to the first control signal SR[n−1:0], and the variable resistor 41 is set to have a resistance value corresponding to the second control signal DR[m−1:0]. The switch 51 connects the common terminal C to one of the terminals A, B corresponding to a control signal SC supplied from an exterior.

In this configuration, at the first step, the switch 51 is caused to connect the drain of the NMOS transistor 32 to the constant current source 31. In this case, the variable resistor control circuit 12a operates similarly to the first control circuit unit 21 in FIG. 4. At the second step, the switch 51 is caused to connect the drain of the NMOS transistor 32 to the variable resistor 41. In this case, the variable resistor control circuit 12a operates similarly to the second control circuit unit 22 in FIG. 4.

In this manner, the same operation as the variable resistor control circuit 12 according to the first embodiment can be achieved in a smaller circuit size. Note that the switch 51 must have a sufficiently low ON resistance. If the switch 51 is implemented as an analog switch, a greater transistor size (W/L) must be used in the analog switch.

In other embodiments, a smaller amount of current may be consumed in the variable resistor control circuit 12a by setting the ratio of the consumption current values of the oscillation circuit 11 to the variable resistor control circuit 12a to X:1.

Figure 13:
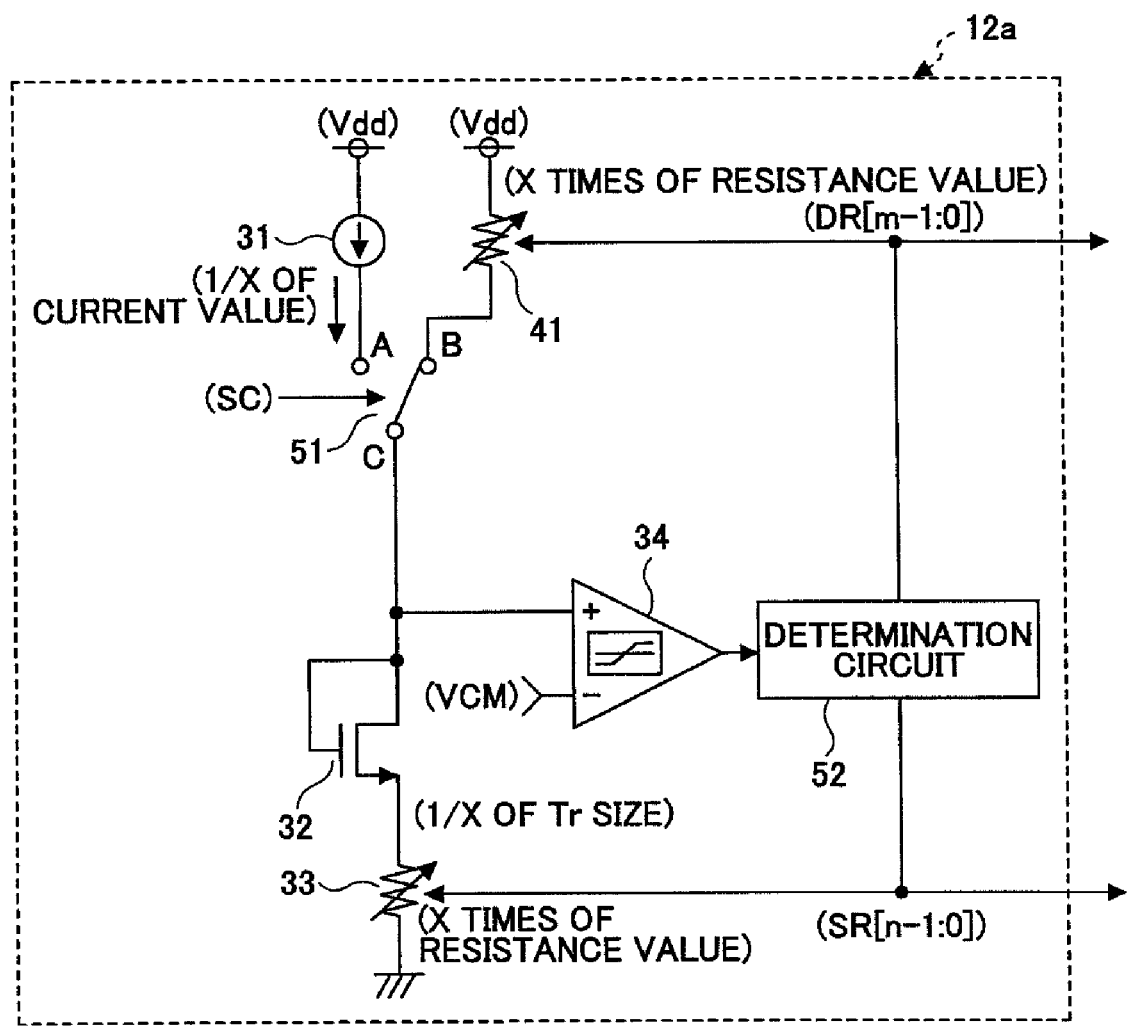
FIG. 13 illustrates another example of the variable resistor control circuit 12a in FIG. 12.

For example, in the variable resistor control circuit 12a in FIG. 13, the current value of the constant current source 31 may be set to 1/X of the current value of the constant current source 31 in FIG. 12. Also, the transistor size of (gate width W/gate length L) of the NMOS transistor 32 may be set to 1/X of the transistor size of the NMOS transistor 32 in FIG. 12 and the respective resistance values of the variable resistors 33, 41 may be set to X times of the resistance values of the variable resistors 33, 41 in FIG. 12. In this configuration, the same operation point as that in FIG. 12 can be achieved. In this manner, the current consumed in the variable resistant control circuit 12a can be reduced to 1/X of that in FIG. 12. Note that X may be an arbitrary real number and does not have to be an integer.

In this manner, in the voltage control oscillator according to the second embodiment, the NMOS transistors 32, 42 and the variable resistors 33, 43 and the comparators 34, 44 in the first control circuit unit 21 and the second control circuit unit 22 are integrated, and the switch 51 switches between connections of the drain of the NMOS transistor 32 to either the constant current source 31 or the variable resistor 41. According to this configuration, the same effect as the first embodiment can be achieved with a smaller circuit size than the first embodiment, resulting in lower cost.

In the first and second embodiments, at least one of the PMOS transistors P(0) to P(m−1) are caused to turn ON, while at least one of the NMOS transistors N(0) to N(n−1) are caused to turn ON. In other embodiments, all of the NMOS transistors N(0) to N(n−1) and/or all of the PMOS transistors P(0) to P(m−1) may be switched OFF. In this case, extremely greater resistance values can be achieved in the variable resistors 7 and/or 8, which can cut off the current. For example, while the variable resistor control circuit is operating, all MOS transistors in the variable resistors 7 and/or 8 in the oscillation circuit 11 are switched OFF, which can put the oscillation circuit 11 into a sleep state.

Similarly, the variable resistor control circuit can be put into sleep state by switching all MOS transistors in a variable resistor in the variable resistant control circuit into an OFF state like the variable resistors 7, 8, resulting suppression of increase in the consumption current in the voltage control oscillator. For example, the variable resistor control circuit may be put into an OFF state by setting the resistance values of the variable resistors 7 and/or 8 to high resistance states, which can put the oscillation circuit 11 into a sleep state. Also, when the operation of the variable resistor control circuit has been finished, the variable resistor control circuit may store respective states of the output first control signal SR[n−1:0] and the output second control signal DR[m−1:0] and may be put into a sleep state during operation of the oscillation circuit 11 by setting the respective resistance values of the variable resistors in the variable resistor control circuit to high resistance states. In this manner, a smaller amount of current can be consumed in the voltage control oscillator.

Also, in the first and second embodiments, some circuits may be provided in the variable resistor control circuit for generating the reference voltage VCM.

According to one aspect of the voltage control oscillator described herein, a variable resistor can be used instead of a constant current source to control current flowing in an oscillation circuit including the inductor unit, the variable capacitance unit and the negative resistance unit. As a result, it is possible to eliminate shot noise and flicker noise of a transistor caused in a current mirror circuit used for noise of the constant current source, amplification of the current and folding back, resulting in better phase noise characteristic than conventional voltage control oscillators where a constant current source is used.

In addition, the voltage control oscillator can operate stably over variations of process parameters, temperature and a source voltage, compared to conventional voltage control oscillators where a fixed resistor is used rather than the variable resistor.

The present invention is not limited to the specifically disclosed embodiments, and variations and modifications may be made without departing from the scope of the present invention.

The present application is based on Japanese Priority Patent Application No. 2008-060648 filed on Mar. 11, 2008, the entire contents of which are hereby incorporated herein by reference.

What is claimed is:

1. A resonance type voltage control oscillator for generating a signal with a frequency corresponding to an input voltage, comprising:

an inductor unit configured to include two inductors serially coupled to each other;

a variable capacitance unit coupled to the inductor unit in parallel;

a negative resistance unit configured to serve as a negative resistor coupled to the inductor unit in parallel;

a first variable resistor configured to have a resistance value corresponding to an input first control signal, the first variable resistor being coupled between a connection between resistors in the negative resistance unit and a negative side source voltage;

a second variable resistor configured to have a resistance value corresponding to an input second control signal, the second variable resistor being coupled between a positive side source voltage and a connection between the inductors; and a variable resistor control circuit unit configured to generate the first control signal and the second control signal and control respective resistance values of the first variable resistor and the second variable resistor, wherein the variable resistor control circuit unit is configured to control the respective resistance values of the first variable resistor and the second variable resistor to set current flowing in the inductor unit, the variable capacitance unit and the negative resistance unit to a desired current value, wherein the variable resistor control circuit unit includes:

a first control circuit unit configured to generate the first control signal; and a second control circuit unit configured to generate the second control signal, and the first control circuit unit includes:

a first reference transistor configured to have a resistance value equal to a total resistance value of the negative resistance unit;

a constant current source coupled between the positive side source voltage and a current input end of the first reference transistor, the constant current source being configured to supply a predefined constant current to the first reference transistor;

a third variable resistor coupled between a current output end of the first reference transistor and the negative side source voltage; and a first resistor control circuit configured to control a resistance value of the third variable resistor to set a voltage of a connection between the constant current source and the first reference transistor to a predefined reference voltage, and the first control signal comprises a control signal supplied from the first resistor control circuit to the third variable resistor.

2. The voltage control oscillator as claimed in claim 1, wherein the inductor unit comprises a 3-terminal inductor, and the second variable resistor is coupled between the positive side source voltage and a middle point of the 3-terminal inductor.

3. The voltage control oscillator as claimed in claim 1, wherein the negative resistance unit includes a first transistor and a second transistor, the first and second transistors comprising identical conductive type of unipolar transistors, the unipolar transistors being cross-coupled to each other.

4. The voltage control oscillator as claimed in claim 1, wherein the first reference transistor comprises the same conductive type of unipolar transistor as the first and second transistors, and the first reference transistor has a total transistor size of respective transistor sizes of the first transistor and the second transistor.

5. The voltage control oscillator as claimed in claim 1, wherein the first reference transistor comprises the same conductive type of unipolar transistor as the first and second transistors, and the first reference transistor has 1/X of a total transistor size of respective transistor sizes of the first transistor and the second transistor wherein the X is a real number, and the constant current source supplies 1/X of the constant current value, and the third variable resistor is configured to have X times of the resistance value.

6. The voltage control oscillator as claimed in claim 1, wherein the second control circuit unit includes:

a second reference transistor configured to have a resistance value equal to a total resistance value of the negative resistance unit;

a fourth variable resistor coupled between the positive side source voltage and a current input end of the second reference transistor;

a fifth variable resistor configured to have a resistance value corresponding to the first control signal, the fifth variable resistor being coupled between a current output end of the second reference transistor and the negative side power voltage; and a second resistor control circuit configured to control a resistance value of the fourth variable resistor to set a voltage of a connection between the fourth variable resistor and the second reference transistor to the predefined reference voltage, and the second control signal comprises a control signal supplied from the second resistor control circuit to the fourth variable resistor.

7. The voltage control oscillator as claimed in claim 6, wherein the second reference transistor comprises the same conductive type of unipolar transistor as the first and second transistors, and the second reference transistor has a total transistor size of respective transistor sizes of the first transistor and the second transistor.

8. The voltage control oscillator as claimed in claim 6, wherein the second reference transistor comprises the same conductive type of unipolar transistor as the first and second transistors, and the second reference transistor has 1/X of a total transistor size of respective transistor sizes of the first transistor and the second transistor wherein the X is a real number, and the fourth variable resistor and the fifth variable resistor are configured to have X times of the respective resistance values.

9. The voltage control oscillator as claimed in claim 1, wherein the first variable resistor and the second variable resistor are configured to have high resistance states depending on the first and second control signals supplied from the variable resistor control circuit unit to be put into a OFF state, and the variable resistance control circuit unit is configured to turn the first variable resistor and/or the second variable resistor into the OFF state and to operate in a low current consumption mode.

10. The voltage control oscillator as claimed in claim 1, wherein individual variable resistors in the variable resistor control circuit unit are configured to have high resistance states depending on supplied control signals and are put into an OFF state, and the variable resistance control circuit unit is configured to cause the individual variable resistors to be in the OFF state and to operate in a low current consumption mode.

11. A resonance type voltage control oscillator for generating a signal with a frequency corresponding to an input voltage, comprising:

an inductor unit configured to include two inductors serially coupled to each other;

a variable capacitance unit coupled to the inductor unit in parallel;

a negative resistance unit configured to serve as a negative resistor coupled to the inductor unit in parallel;

a first variable resistor configured to have a resistance value corresponding to an input first control signal, the first variable resistor being coupled between a connection between resistors in the negative resistance unit and a negative side source voltage;

a second variable resistor configured to have a resistance value corresponding to an input second control signal, the second variable resistor being coupled between a positive side source voltage and a connection between the inductors; and a variable resistor control circuit unit configured to generate the first control signal and the second control signal and control respective resistance values of the first variable resistor and the second variable resistor, wherein the variable resistor control circuit unit is configured to control the respective resistance values of the first variable resistor and the second variable resistor to set current flowing in the inductor unit, the variable capacitance unit and the negative resistance unit to a desired current value, wherein the variable resistor control circuit unit includes:

a reference transistor configured to have a resistance value equal to a total resistance value of the negative resistance unit;

a constant current source configured to generate a predefined constant current, a current input end of the constant current source being coupled to a positive side source voltage;

a sixth variable resistor, one end of the sixth variable resistor being coupled to the positive side source voltage;

a switch circuit configured to connect a current input end of the reference transistor to either a current output end of the constant current source or the other end of the sixth variable resistor;

a seventh variable resistor coupled between a current output end of the reference transistor and the negative side source voltage; and a resistor control circuit configured to control respective resistance values of the sixth and seventh variable resistors to set a voltage of a current input end of the reference transistor to a predefined reference voltage, and the first control signal comprises a control signal supplied from the resistor control circuit to the seventh variable resistor, and the second control signal comprises a control signal supplied from the resistor control circuit to the sixth variable resistor.

12. The voltage control oscillator as claimed in claim 11, wherein the reference transistor comprises the same conductive type of unipolar transistor as the first and second transistors, and the first reference transistor has a total transistor size of respective transistor sizes of the first transistor and the second transistor.

13. The voltage control oscillator as claimed in claim 11, wherein the reference transistor comprises the same conductive type of unipolar transistor as the first and second transistors, and the reference transistor has 1/X of a total transistor size of respective transistor sizes of the first transistor and the second transistor wherein the X is a real number, and the sixth variable resistor and the seventh variable resistor are configured to have X times of the respective resistance values.

\* \* \* \* \*